US006655011B1

(12) United States Patent
Kornrumpf et al.

(10) Patent No.: US 6,655,011 B1
(45) Date of Patent: Dec. 2, 2003

(54) METHOD FOR FABRICATING A SWITCH STRUCTURE

(75) Inventors: William Paul Kornrumpf, Albany, NY (US); Robert John Wojnarowski, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 133 days.

(21) Appl. No.: 09/677,718

(22) Filed: Oct. 2, 2000

Related U.S. Application Data

(62) Division of application No. 09/192,103, filed on Nov. 13, 1998, now Pat. No. 6,188,301.

(51) Int. Cl.$^{7}$ .......................... H01H 11/00; H05K 3/20; H05K 3/02; H01L 23/48

(52) U.S. Cl. ............................ 29/622; 29/831; 29/846; 257/690

(58) Field of Search .......................... 200/249; 333/236, 333/101, 105, 262; 174/255; 285/381.2, 381.3; 29/622, 846, 852, 831; 148/402, 563, 675; 428/209, 210, 901; 257/690, 522

(56) References Cited

U.S. PATENT DOCUMENTS 4,714,516 A 12/1987 Eichelberger et al. ......... 216/62
4,764,485 A 8/1988 Loughran et al. ............ 438/317
4,780,177 A 10/1988 Wojnarowski et al. ......... 216/45
4,783,695 A 11/1988 Eichelberger et al. ....... 257/668
4,835,704 A 5/1989 Eichelberger et al. . 395/500.22
4,842,677 A 6/1989 Wojnarowski et al. ......... 216/65
4,864,824 A * 9/1989 Gabriel et al. ................. 60/527
4,894,115 A 1/1990 Eichelberger et al. ........ 134/1.1
4,896,098 A 1/1990 Haritonidis et al. ......... 324/663
4,943,750 A 7/1990 Howe et al. ................. 310/309
4,997,521 A 3/1991 Howe et al. ................... 216/17
5,161,093 A 11/1992 Gorczyca et al. ............ 361/795
5,325,880 A 7/1994 Johnson et al. ................. 137/1
5,430,597 A 7/1995 Bagepalli et al. ............ 361/102
5,510,598 A * 4/1996 Kawam et al. ............. 219/505
5,619,061 A * 4/1997 Goldsmith et al. ......... 257/528

OTHER PUBLICATIONS

Wojnarowski, et al, U.S. patent application Ser. No. 08/781, 972 filed Dec. 23, 1996, entitled "Interface Structures for Electronic Devices". Pat No. –59001674.

Wojnarowski, et al, U.S. patent application Ser. No. 08/922, 018 filed Sep. 2, 1997, C.I.P. of Ser. No. 08/781,972 filed Dec. 23, 1996, entitled "Flexible Interface Structures for Electronic Devices". Pat No 5938452.

* cited by examiner

*Primary Examiner*—Carl J. Arbes
*Assistant Examiner*—Tim Phan

(57) ABSTRACT

A switch structure having a base surface; a first high density interconnect (HDI) plastic interconnect layer overlying the base surface layer; a cavity within the HDI plastic interconnect layer; at least one patterned shape memory alloy (SMA) layer overlying the HDI plastic interconnect layer and the cavity, and at least one patterned conductive layer over the at least one patterned SMA layer; a fixed contact pad within the cavity and attached to the base surface and a movable contact pad attached to a portion of the first patterned SMA layer within the cavity such that when the first and second patterned SMA layers and the first and second patterned metallized layers are in a first stable position, the movable contact pad touches the fixed contact pad, thereby providing an electrical connection and forming a closed switch. The structure has a second stable position in which the SMA and metallized layers are flexed away from the cavity so that the contact pads are not in contact and form an open switch.

5 Claims, 14 Drawing Sheets

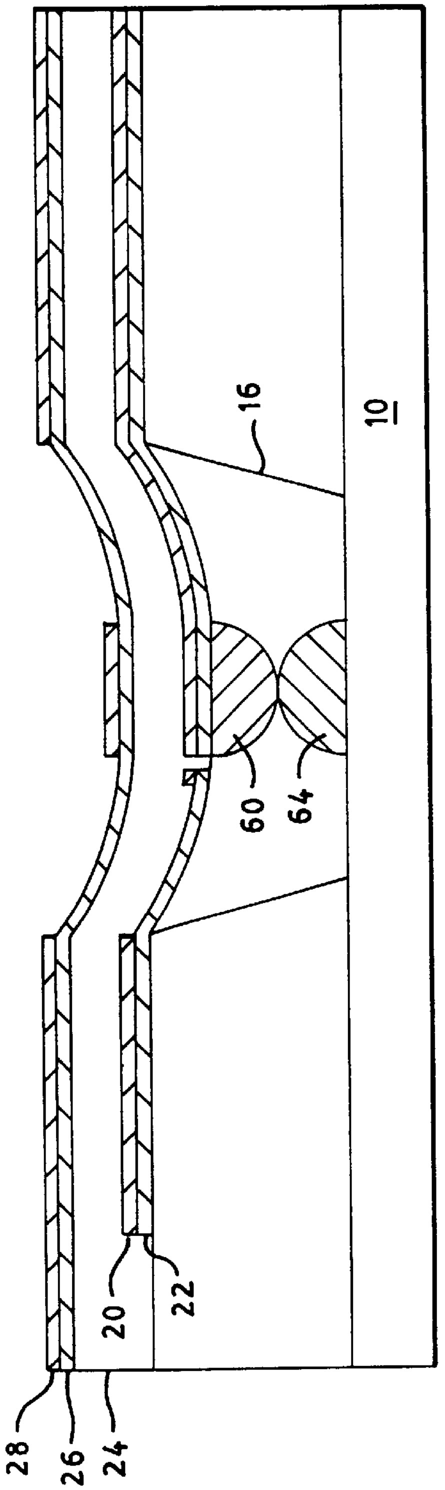
FIG. 13
FIG. 11
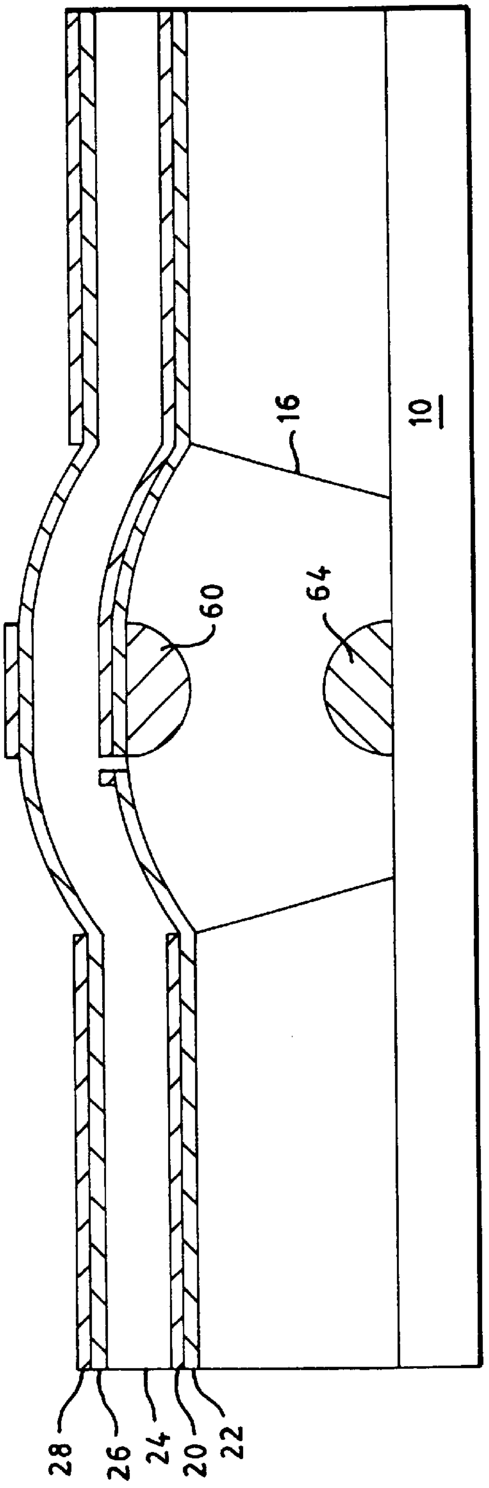

METHOD FOR FABRICATING A SWITCH STRUCTURE

This application is a division of application Ser. No. 09/192,103 now U.S. Pat. No. 6,188,301, filed Nov. 13, 1998 which is hereby incorporated by reference in its entirety.

This invention was made with government support under contract number F29601-92-C-0137 awarded by the United States Air Force.

BACKGROUND OF THE INVENTION

The present invention relates generally to microelectromechanical (MEM) structures and methods for fabricating them.

Micromachining is a recent technology for fabricating micromechanical moving structures. In general, semiconductor batch fabrication techniques are employed to achieve what is in effect threedimensional machining of single-crystal and polycrystalline silicon and silicon dielectrics and multiple metal layers, producing such structures as micromotors and microsensors. Thus, except for selective deposition and removal of materials on a substrate, conventional assembly operations are not involved. By way of example, a microsensor is disclosed in Haritonidis et al. U.S. Pat. No. 4,896,098; and an electrostatic micromotor is disclosed in Howe et al. U.S. Pat. Nos. 4,943,750 and 4,997,521.

Conventional machining is impractical for expeditiously fabricating a multiple contact switch system which has submillimeter features because machine tools are limited to larger dimensions and are slow because they operate sequentially. Silicon microelectromechanical (MEM) switch structures are somewhat limited as they must be manufactured, diced into individual switch structures, and then placed into the circuit. Conventional MEMs structures cannot be co-fabricated with hybrid and HDI circuitry due to the unique processing requirements of Si based MEMs devices.

Whereas conventional Si based MEMS structures utilize the differential expansion co-efficient of the silicon, silicon dielectric and metallic layers, the use of shape metal alloy (SMA) in a MEMs structure results in a higher specific work output due to the SMA transition effect. SMAs are typically annealed alloys of primarily titanium and nickel that undergo a predictable phase change at a transition temperature. During this transition the SMA material experiences a large change in dimensions that can be used in actuators for valves and the like see Johnson et al., U.S. Pat. No. 5,325,880. Typical thin films of SMA materials are formed using sputtering techniques to deposit layers ranging from 2000 angstroms to 125 microns. These sputtered films are generally polycrystalline and require heat treatment (annealing) in an oxygen free environment, cold working or a combination to produce the crystalline phase used in MEMs devices. Purely thermal annealing can require temperatures on the order of 500° C.

Also related to the invention is what is known as high density interconnect (HDI) technology for multi-chip module packaging, such as is disclosed in Eichelberger et al. U.S. Pat. No. 4,783,695. Very briefly, in systems employing this high density interconnect structure, various components, such as semiconductor integrated circuit chips, are placed within cavities formed in a ceramic substrate. A multi-layer overcoat structure is then built up to electrically interconnect the components into an actual functioning system. To begin the multi-layer overcoat structure, a polyimide dielectric film, such as KAPTON™ polyimide (available from E. I. Dupont de Nemours & Company, Wilmington, Del.), about 0.5 to 3 mils (12.7 to 76 microns) thick, is laminated across the top of the chips, other components and the substrate, employing ULTEM™ polyetherimide resin (available from General Electric Company, Pittsfield, Mass.) or other adhesives. The actual as-placed locations of the various components and contact pads thereon are determined by optical sighting, and via holes are adaptively laser drilled in the KAPTON™ film and adhesive layers in alignment with the contact pads on the electronic components. Exemplary laser drilling techniques are disclosed in Eichelberger et al. U.S. Pat. Nos. 4,714,516 and 4,894,115; and in Loughran et al. U.S. Pat. No. 4,764,485. Such HDI vias are typically on the order of one to two mils (25 to 50 microns) in diameter. A metallization layer is deposited over the KAPTON film layer and extends into the via holes to make electrical contact to chip contact pads. This metallization layer may be patterned to form individual conductors during its deposition process, or it may be deposited as a continuous layer and then patterned using photoresist and etching. The photoresist is preferably exposed using a laser which is scanned relative to the substrate to provide an accurately aligned conductor pattern upon completion of the process. Exemplary techniques for patterning the metallization layer are disclosed in Wojnarowski et al. U.S. Pat. Nos. 4,780,177 and 4,842,677; and in Eichelberger et al. U.S. Pat. No. 4,835,704 which discloses an "Adaptive Lithography System to Provide High Density Interconnect." Any misposition of the individual electronic components and their contact pads is compensated for by an adaptive laser lithography system as disclosed in aforementioned U.S. Pat. No. 4,835,704. Additional dielectric and metallization layers are provided as required in order to make all of the desired electrical connections among the chips. This process of metal patterning on polymers, lamination, via drilling and additional metal deposition and patterning can be used to fabricate free standing precision flexible circuits, back plane assemblies and the like when the first polymer layer is not laminated over a substrate containing semiconductor die as described in Eichelberger et al 5,452,182 "Flexible HDI structure and Flexibly Interconnected System".

SUMMARY OF THE INVENTION

It would be desirable to provide an integral switching mechanism within the HDI circuit environment. Previous MEM based switches and actuators required the insertion of individual MEM parts into the HDI circuit and the subsequent routing of signals to the MEM structure, particularly when a large number of switches were required or high isolation of the switched signals was desired. The use of an integral MEMS within an HDI structure will allow switches to be positioned in desired locations with a minimum of signal diversion and routing. In addition, it will not be necessary to handle and insert the fragile MEM actuators into cavities in the HDI circuit and suffer the yield loss of this insertion process. The use of integral switching mechanisms, within HDI architecture, will result in a lower cost system.

In one embodiment of the present invention, a structure comprises: a base surface; a plastic interconnect layer overlying the base surface; a cavity within the plastic interconnect layer extending therethrough to the base surface; a patterned shape memory alloy (SMA) layer patterned over the plastic interconnect layer and the cavity; and a conductive layer patterned over the SMA layer. The SMA layer contracts and moves the patterned SMA and conductive layers further away from the base surface when electricity is applied to the SMA layer.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

FIG. 11 is a sectional view similar to FIG. 10 further showing the first and second patterned SMA layers, the first and second conductive layers, and the second plastic interconnect layer partially removed, filler material partially removed, and a movable contact pad and a fixed contact pad wherein the movable contact pad and the fixed contact pad are shown as an open switch.

FIG. 13 is a sectional view similar to that of FIG. 11 further showing the movable contact pad contacting the fixed contact pad as a closed switch in the first stable position.

DETAILED DESCRIPTION OF THE INVENTION

In several embodiments of the present invention shown in FIGS. 1–15, a MEM based switch structure or actuator (which may be bistable) can be fabricated using traditional HDI processing steps. The switch structure is operated by selectively passing current through the patterned SMA layers thereby causing them to heat above the SMA layer transition temperature and causing a deformation of the heated layer. In FIGS. 1–8 the switch is shown with an outer movable contact pad; in FIGS. 9–13 the switch is shown with an inner movable contact pad; and in FIGS. 14–15 the switch is shown with inner and outer movable contact pads.

Figure 16:
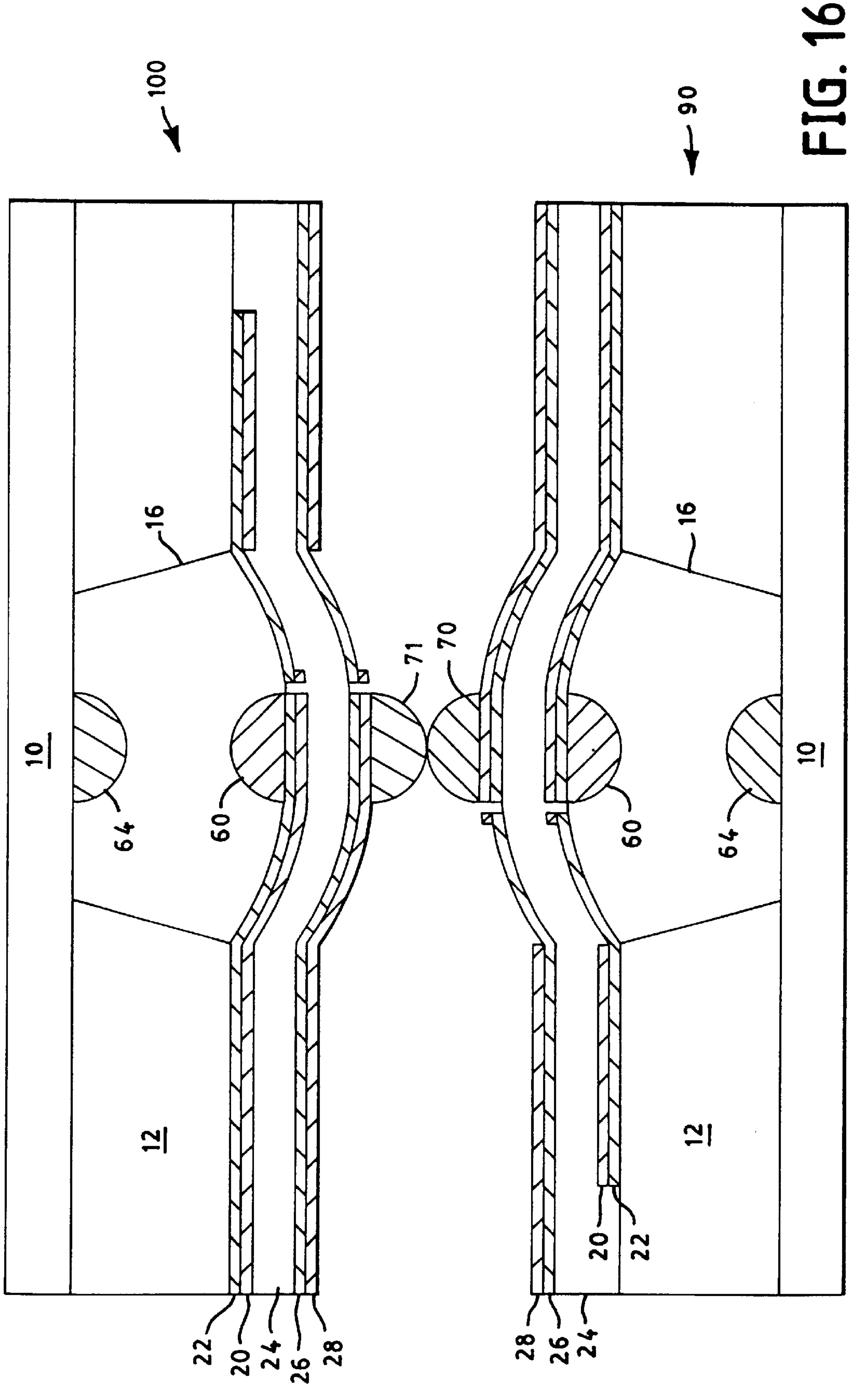
FIG. 16 is a cross-sectional view of another embodiment of a four position combination switch structure embodiment in a first stable position.
Figure 17:
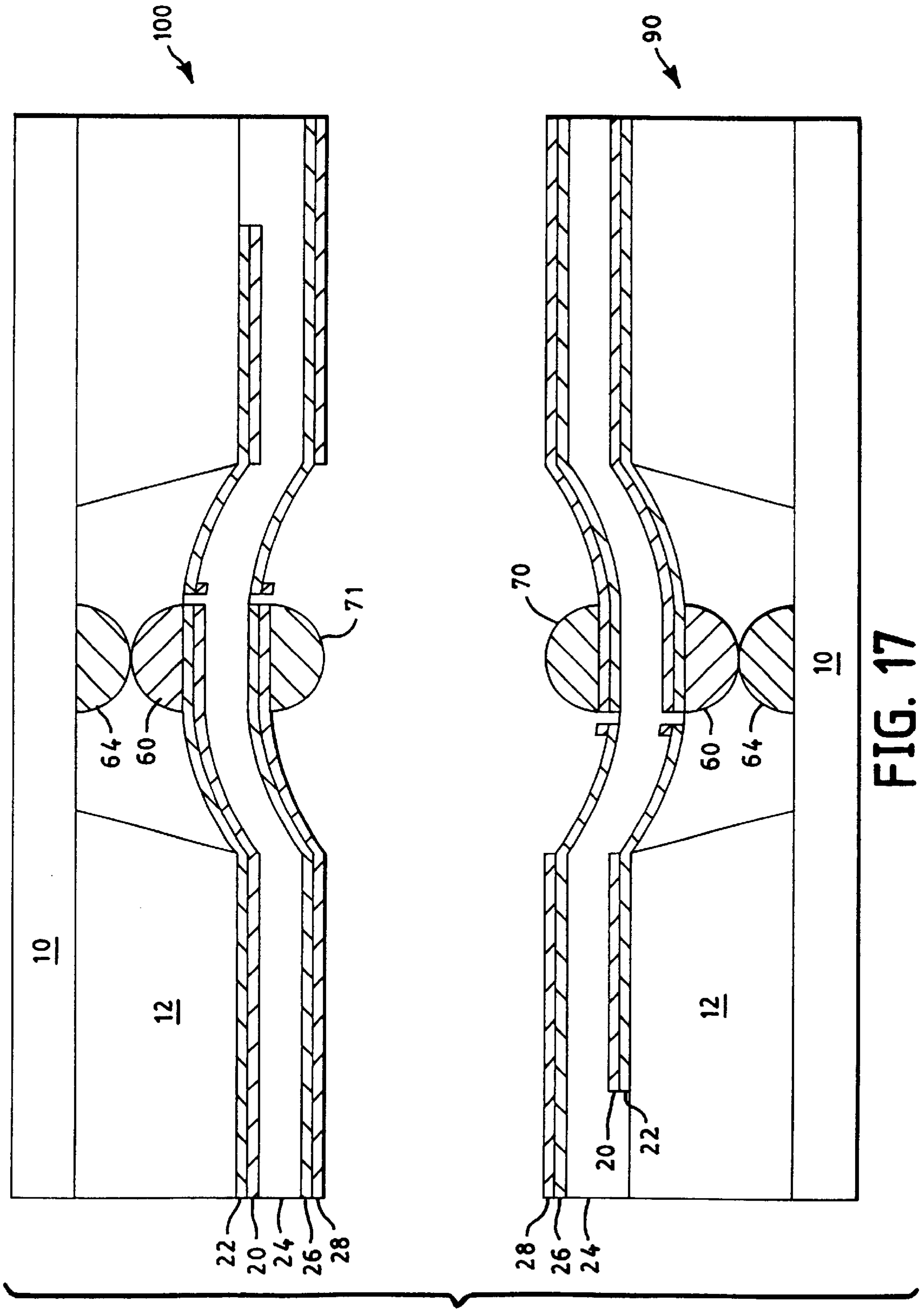
FIG. 17 is a cross-sectional view of the FIG. 16 embodiment of the four position combination switch structure embodiment in a second stable position.

In another embodiment of the present invention shown in FIGS. 16 and 17, a double switch structure is fabricated with two switches placed in an arrangement where one bistable switch structure is inverted directly over a second bistable switch structure and contact pads are added to each bistable switch structure. A double switch structure is formed when both bistable switch structures are in a position whereby the two additional contact pads are in direct contact and complete an electrical connection.

Figure 19:
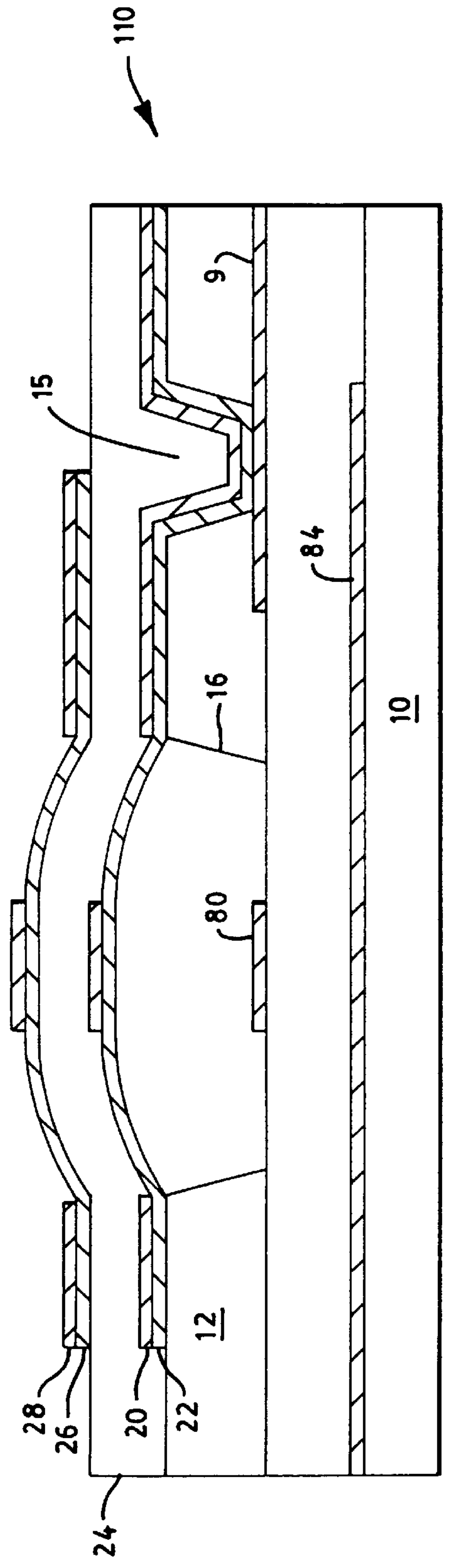
FIG. 19 is a view similar to FIG. 18 further showing the embodiment of a RF or microwave switch in an open position.
Figure 18:
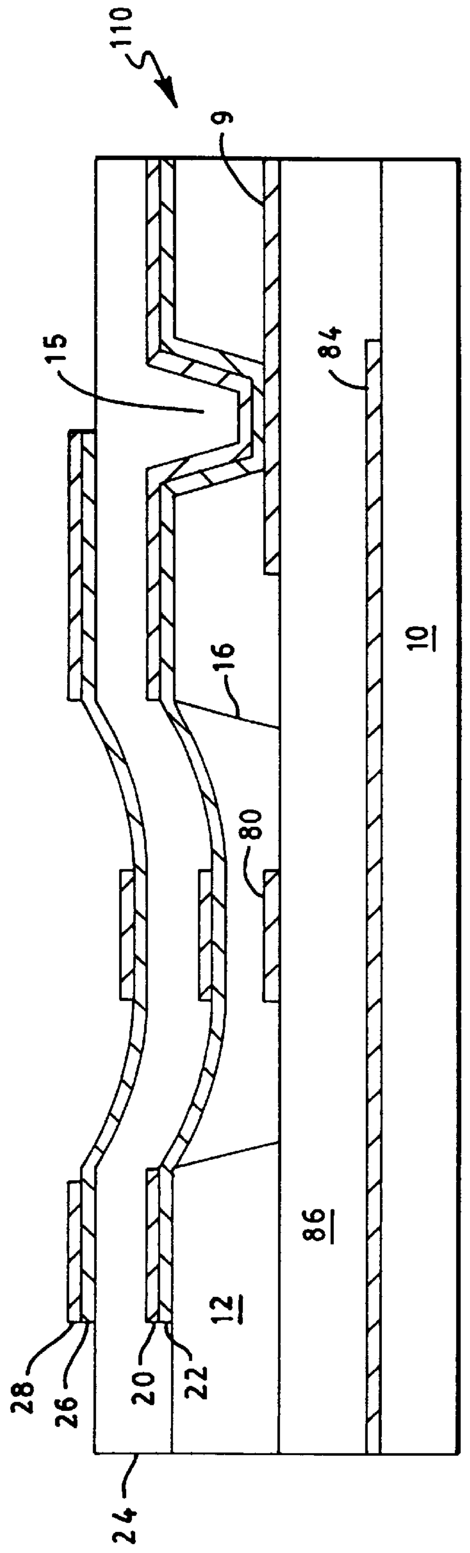
FIG. 18 is a cross sectional view showing an embodiment of a RF or microwave switch in a shunt position.

In another embodiment of the present invention, as shown in FIGS. 18 and 19, an HDI SMA actuator is used to actuate a capacitive switch in a shunt arrangement. This embodiment is useful as a radiofrequency (RF) or microwave switch, for example.

Figure 20:
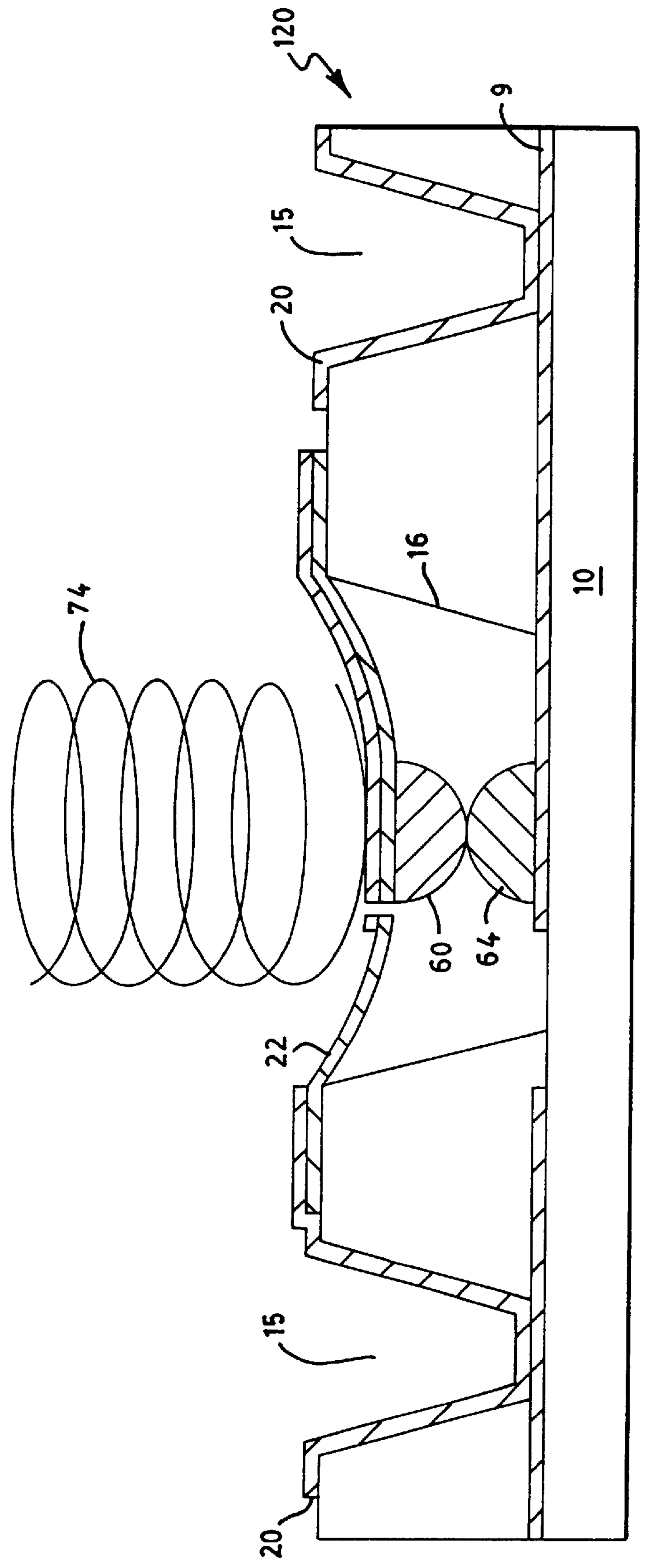
FIG. 20 is a cross-sectional view showing a further embodiment of a switch structure in a closed position and further showing a force return device.

FIG. 20 illustrates an embodiment similar to that discussed with respect to FIGS. 1–15 wherein the switch need not be bistable. In this embodiment, for example, a force return device such as a spring, for example, is used and only one patterned SMA layer is required.

The SMA HDI switch/actuator can be designed to be an integral component in an HDI circuit thereby allowing its use within the HDI circuitry. While the drawings demonstrate a switch structure fabricated on the lowest HDI layer for simplicity, it is possible to fabricate the switch structure at any layer in a multilayer HDI circuit or back plane interconnection system. The figures have not been drawn to scale so that the switches can be seen in more detail.

Figure 1:
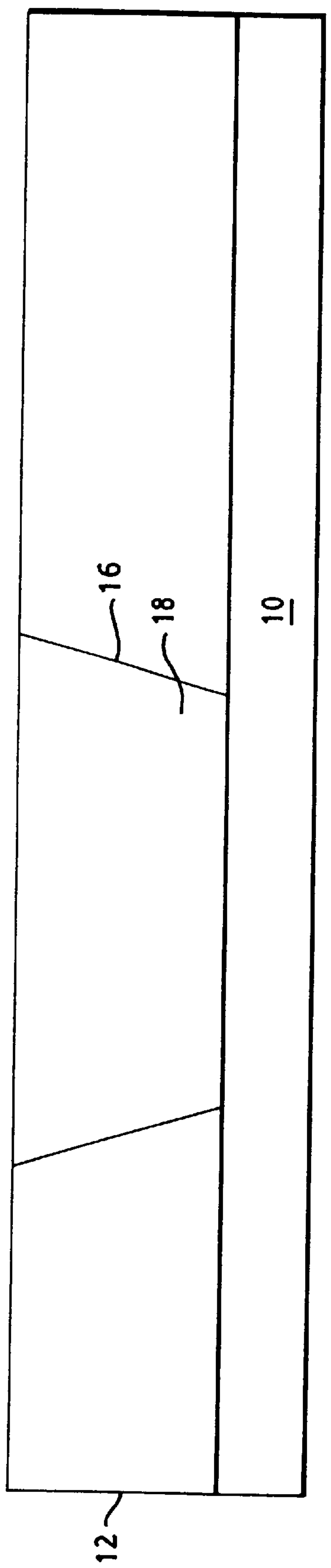
FIG. 1 is a cross-sectional view of a first plastic interconnect layer having a filled cavity overlying a base surface.

FIG. 1 shows a sectional view of a plastic interconnect layer 12 overlying a generally planar base surface 10. The base material 10 may include any suitable ceramic, metal, or polymer, for example. The plastic interconnect layer 12 is a stable coating and comprises a material such as a polyimide or a siloxane polyimide epoxy (SPI/epoxy such as described in Gorczyca et al., U.S. Pat. No. 5,161,093), other epoxies, silicone rubber materials, TEFLON™ polytetrafluoroethylene (TEFLON is a trademark of E.I. duPont de Nemours and Co.), or a printed circuit board material, for example. The plastic interconnect layer may optionally include filler material such as glass or ceramic particles, for example. The plastic interconnect layer is used as an HDI dielectric layer in one embodiment. The plastic interconnect layer 12 can be laminated onto base surface 10 with heat and/or an adhesive (not shown) or deposited on the base surface by a spin, spray, or chemical vapor deposition (CVD) technique, for example.

A cavity 16 is formed in plastic interconnect layer 12 by any appropriate means. In one embodiment, as described in aforementioned Eichelberger et al., U.S. Pat. No. 4,894,115, the dielectric material can be scanned repeatedly with a high energy continuous wave laser to create a hole of desired size and shape. Other appropriate methods of hole formation include, for example, photopatterning photopatternable polyimides and using an excimer laser with a mask. The cavity is subsequently filled with a removable material 18 such as siloxane polyimide (SPI). SPI is a product of MICROSI, Inc., 10028 South 51st Street, Phoenix, Ariz. 85044. Metallized vias (not shown) can be formed and patterned in dielectric material 12 by any appropriate method and extend therethrough for use as electrical interconnection paths.

Figure 2:
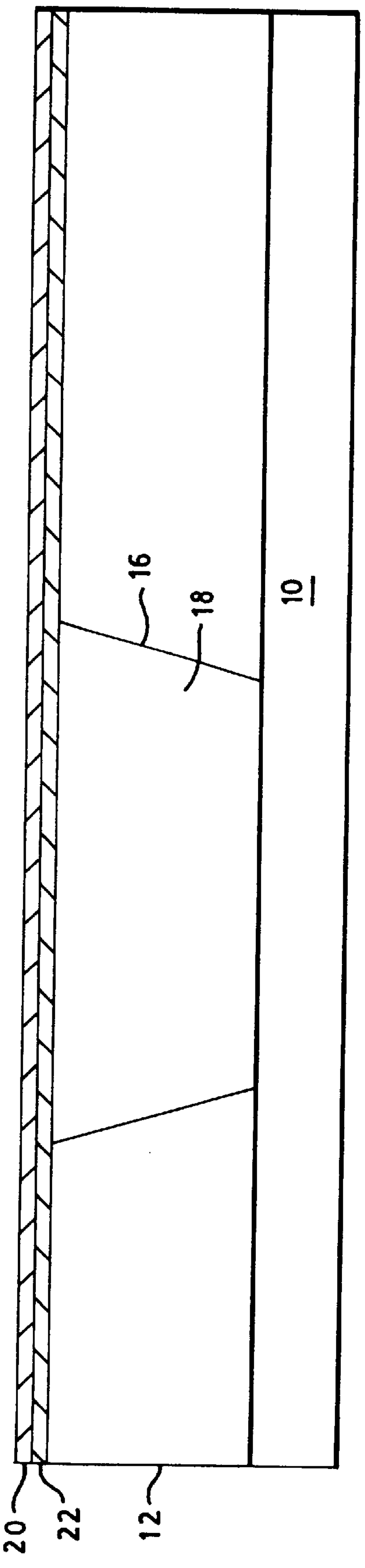
FIG. 2 is a view similar to that of FIG. 1 further including a first shape memory alloy (SMA) layer and a first conductive layer.

As shown in FIG. 2, a first SMA layer 22 is deposited on plastic interconnect layer 12 extending over the removable filler material 18. The first SMA layer 22 may be any suitable shape memory alloy and in one embodiment comprises a titanium nickel alloy in a 50%/50% ratio. TiNi is useful because it undergoes a significant displacement when traversing its transition temperature. The first layer of SMA 22 can be applied by lamination, sputtering, CVD or evaporation, for example.

A first conductive layer 20 is further deposited on first SMA layer 22 over plastic interconnect layer 12 and the filled cavity 16. The first layer of conductive material 20 may be copper or another such suitable material for heat dissipation and for extra current handling or signal routing on the same layer. The first conductive layer 20 can be electroplated copper if additional current handling capability is required.

Figure 3:
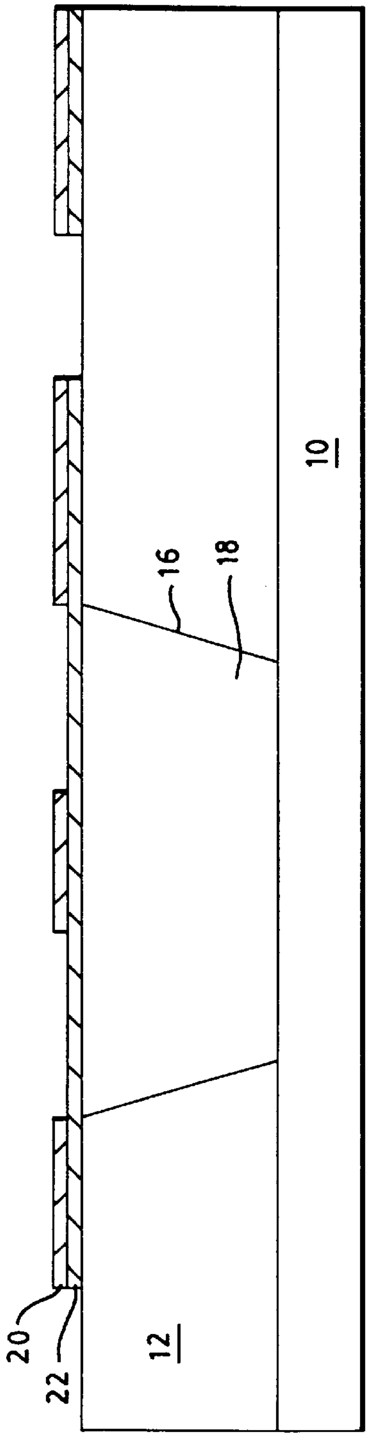
FIG. 3 is a view similar to that of FIG. 2 showing the first conductive and SMA layers patterned.

FIG. 3 shows the first SMA and conductive layers patterned to a desired pattern. The pattern of the first SMA layer 22 and the pattern of the first conductive layer 20 may be the same pattern or different patterns as shown below in FIG. 6 depending on the use of the structure. The SMA layer 22 pattern may include a connection through an HDI via (not shown) to a lower layer where it can be further connected to a control voltage. Aforementioned Eichelberger et al., U.S. Pat. No. 4,835,704, describes a useful adaptive lithography system for patterning metallization, for example. Conventional photoresist and exposure masks may be used as well.

Figure 4:
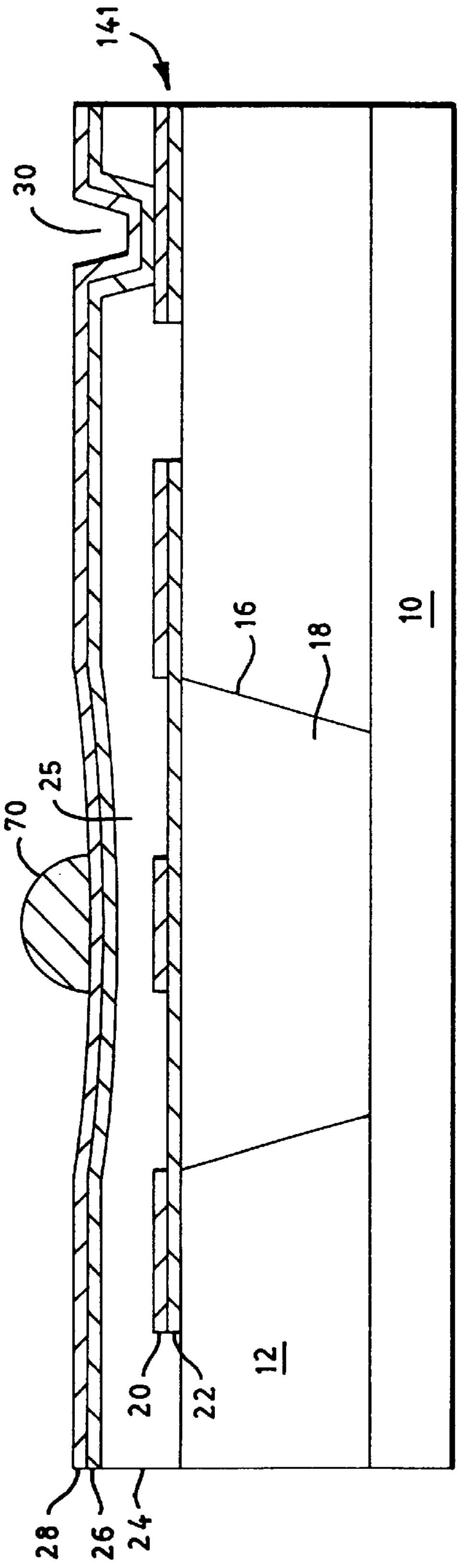
FIG. 4 is a view similar to that of FIG. 3 further showing the 1o addition of a second plastic interconnect layer, a second SMA layer, a second conductive layer, and a patterned switch contact, and an HDI interconnection via.

As shown in FIG. 4, a second plastic interconnect layer 24 can be deposited by spin coating or lamination (standard HDI processes) to form a second plane (via 30 can be formed therein using a process such as described in aforementioned Eichelberger et al., U.S. Pat. No. 4,894,115, for example, and extend to a portion 141 of the patterned SMA and conductive layers 22 and 20 if connections are desired to be formed in this manner) for deposition of a second SMA is layer 26 and a second conductive layer 28 which may comprise materials similar to respective SMA and conductive layers 22 and 20, for example.

In one embodiment, a thinned portion 25, as discussed and shown in aforementioned U.S. application Ser. No. 08/781,972, can intentionally be formed in the second plastic interconnect layer 24 for reducing mechanical stress on arms (shown in FIG. 6), extensions, and/or conductive paths of the patterned SMA and conductive layers. The thinned portion 25 can be formed during, or after application of second plastic interconnect layer 24 by etching, laser ablation, or by heat pressing, for example. The thinned portion 25 of the second plastic interconnect layer 24 will result in a corresponding downward curvature of the second SMA layer 26 and the second conductive layer 28 thereby increasing the compliance of the structure.

Also shown in FIG. 4 is a contact pad 70 which is applied over the second conductive layer by any appropriate matter. In one embodiment, the contact pad comprises a palladium seeded layer conventionally used in electroless plating processing or a palladium seeded layer over a plastic or other suitable shaped pad material such as second conductive layer 28, for example, followed by a palladium layer that can be electroplated with a mask or photoresist process, for example.

Figure 5:
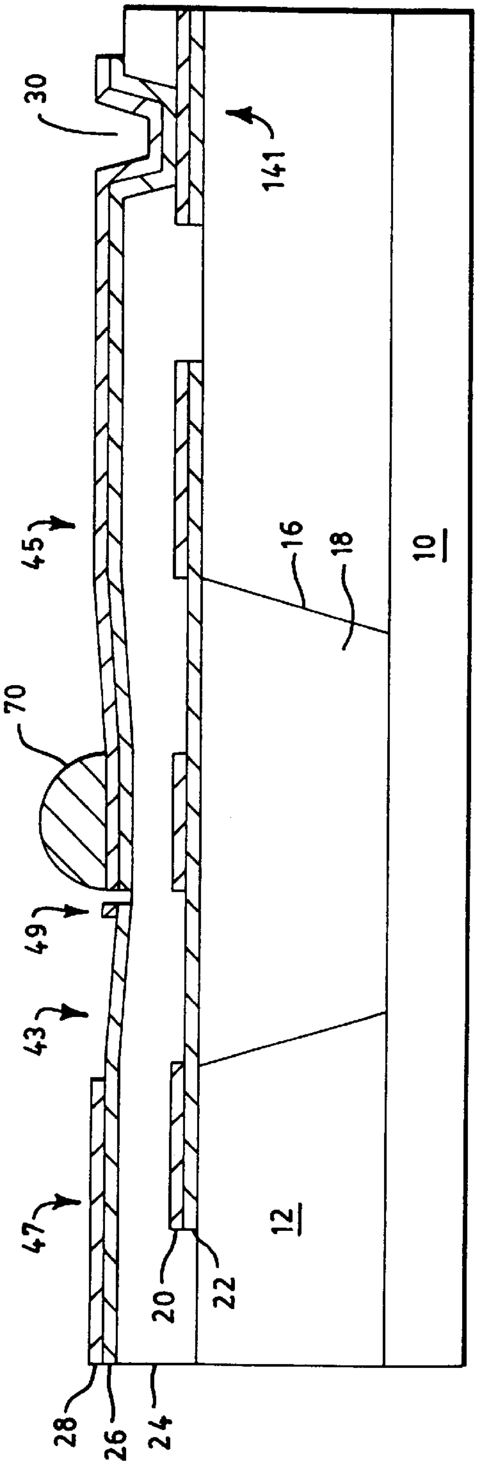
FIG. 5 is a curved sectional view similar to FIG. 4 further showing the second SMA layer patterned, the second conductive layer patterned and the second plastic interconnect layer partially removed.
Figure 6:
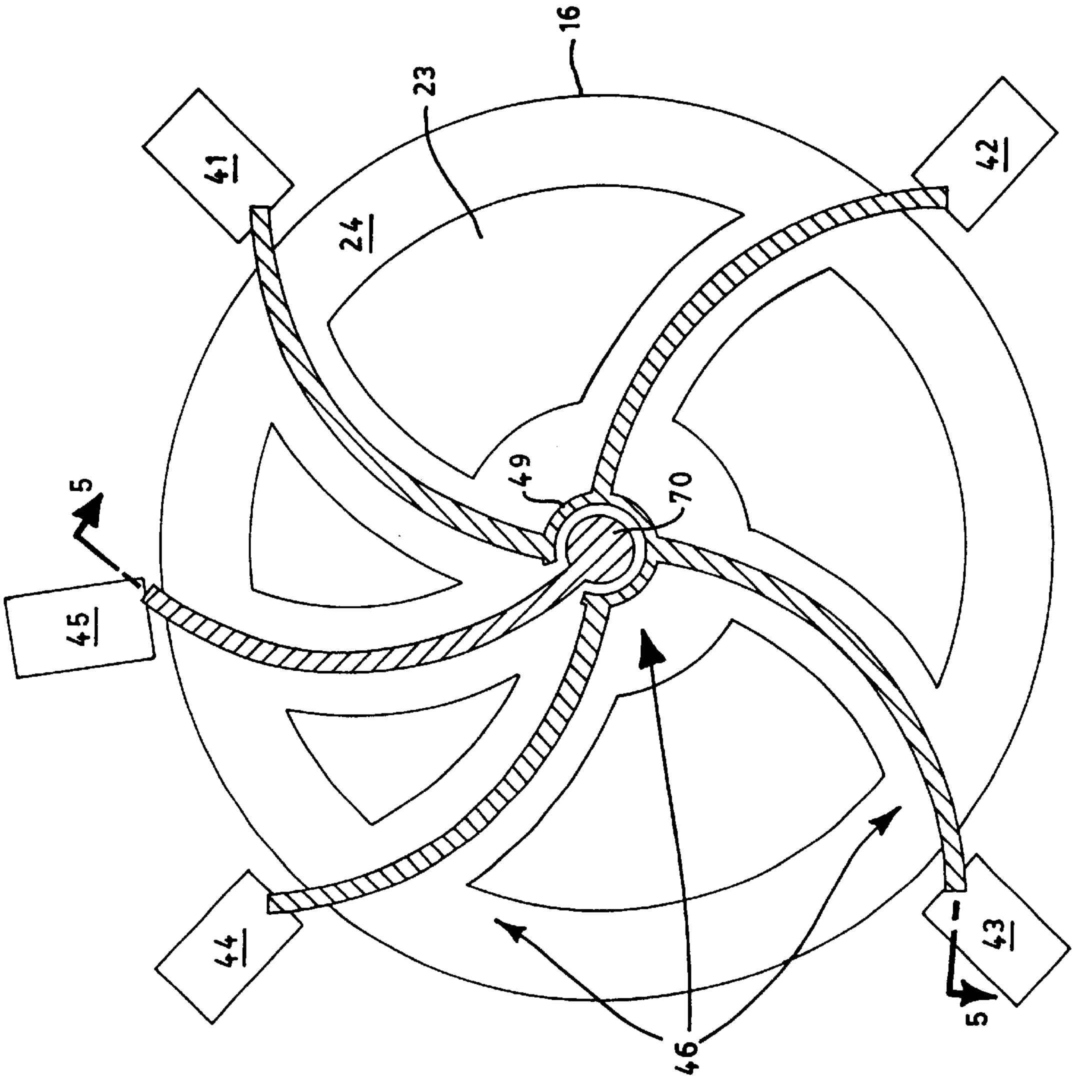
FIG. 6 is a top view of one embodiment of patterning that can be used in the embodiment of FIG. 5 showing areas for signal connection and actuation connection.

The second conductive and second SMA layers are then patterned, as shown in the curved sectional view of FIG. 5 and the top view of FIG. 6. FIG. 5 extends along line 5—5 of FIG. 6 for purposes of example.

In one embodiment, the second SMA layer 26 can also be connected to control lines 141 by via 30 formed in the second plastic interconnect layer 24. The second plastic interconnect layer 24 is then preferably partially removed in a suitable pattern such as in the areas (shown as areas 23 in FIG. 6) overlying removable material 18 by appropriate means. Preferably areas 23 of second plastic interconnect layer 24 are removed over the cavity with layer 24 being left in position under the arms and contact pad 70.

The top view of FIG. 6 illustrates an embodiment of the switch structure showing spiral shaped SMA alloy material switch structure arms for purposes of example only. In one embodiment, these switch elements are patterned to resemble the compliant BGA structures described in commonly assigned Wojnarowski et al. U.S. patent application Ser. No. 08/781,972, entitled "Interface Structures for Electronic Devices" and Wojnarowski U.S. patent application Ser. No. 08/922,018, entitled "Flexible Interface Structures for Electronic Devices.

In FIG. 6, the configuration 46 includes the second SMA and conductive layers and contact pad 70 which form a center portion shown by contact pad 70 and four arms 41, 42, 43, and 44. As further shown, in FIG. 6 a conductor and terminal area 45 can provide a path for current to the switch structure. As further discussed and shown in aforementioned of U.S. application Ser. No. 08/781,972, any number of arms (one or more) can be used, and the arms can have any shape. In the embodiment of FIG. 6, the arms comprise SMA material that is isolated from the conductive layer of the switch and the conductive path and preferably extend to portions 47 (shown in FIG. 5) that include the conductive layer. It is advantageous to have a ring 49 which couples the arms and includes both SMA material and conductive material to provide equal heating to each arm during actuation.

Figure 7:
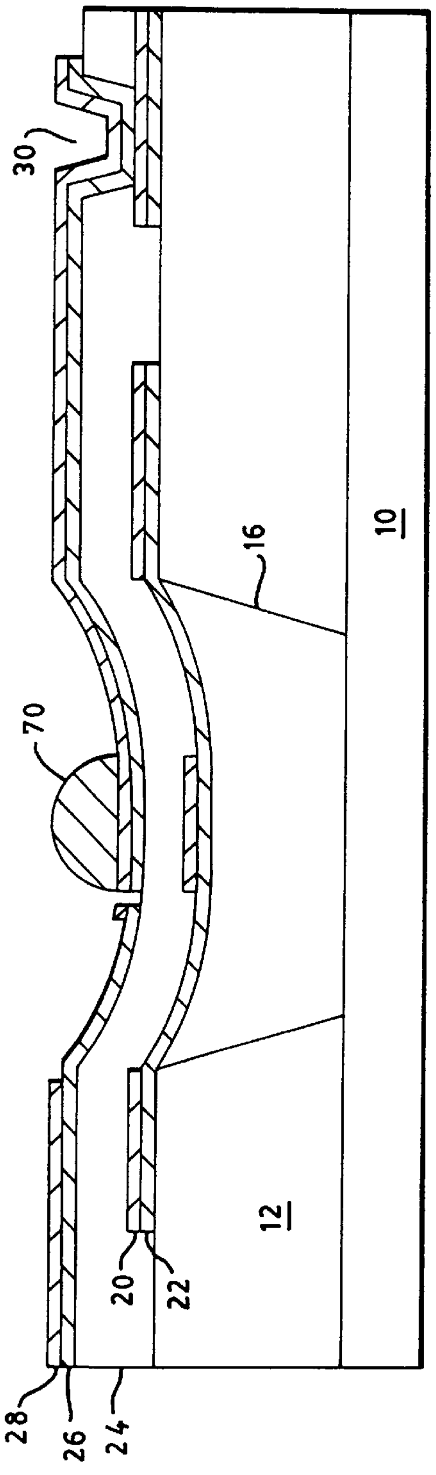
FIG. 7 is a sectional view similar to FIG. 5 further showing the filler material removed from the cavity, and the first patterned SMA layer, the first patterned conductive layer, the second patterned SMA layer, and second patterned conductive layer deformed to a first stable position.

As shown in FIG. 7, at least part of the cavity filler material 18 of FIG. 5 is removed from the cavity 16. The removal of the filler material can be through openings in the substrate or through the dielectric surface (if it was not been removed previously as shown in FIG. 5) by first removing the dielectric using a laser or other patterning step such as RIE removal, and then using a laser, RIE, evaporation or sublimation for removal of the filler material. FIG. 7 further illustrates the switch after it has been annealed and deformed. The annealing and deformation processes result in a crystalline structure that enables the SMA materials to deform and be capable of maintaining selected shapes/positions.

Annealing of the SMA layers can be performed either before or after removal of the cavity filler material. The annealing can be accomplished with any of a number of techniques and is preferably performed in a non-oxidizing atmosphere at a temperature in the range of at least about 500° C. In one embodiment, the SMA layers are heated with electrical currents. In another embodiment, the entire switch is heated in a gas oven. In another embodiment, for example, a laser is used to selectively heat the patterned areas. In another embodiment, the SMA layers are heated by a combination of heat steps or partial heating by one method such as electrical heating and a delta heat to crystallization formation using a second source such as a laser or localized non-oxidizing gas source. Such combinations can be useful to minimize the maximum substrate temperature.

In a preferred embodiment, shaping by deformation occurs after annealing. The second dielectric layer and first and second conductive and SMA layers can be deformed by any appropriate technique. For example, these layers can be cold worked using a micrometer or a controlled pressure membrane technique of placing a bladder over the part and applying pressure to deform the bladder and layers into the cavity. This deformation results in the deformation of the layers to a first stable position.

Figure 8:
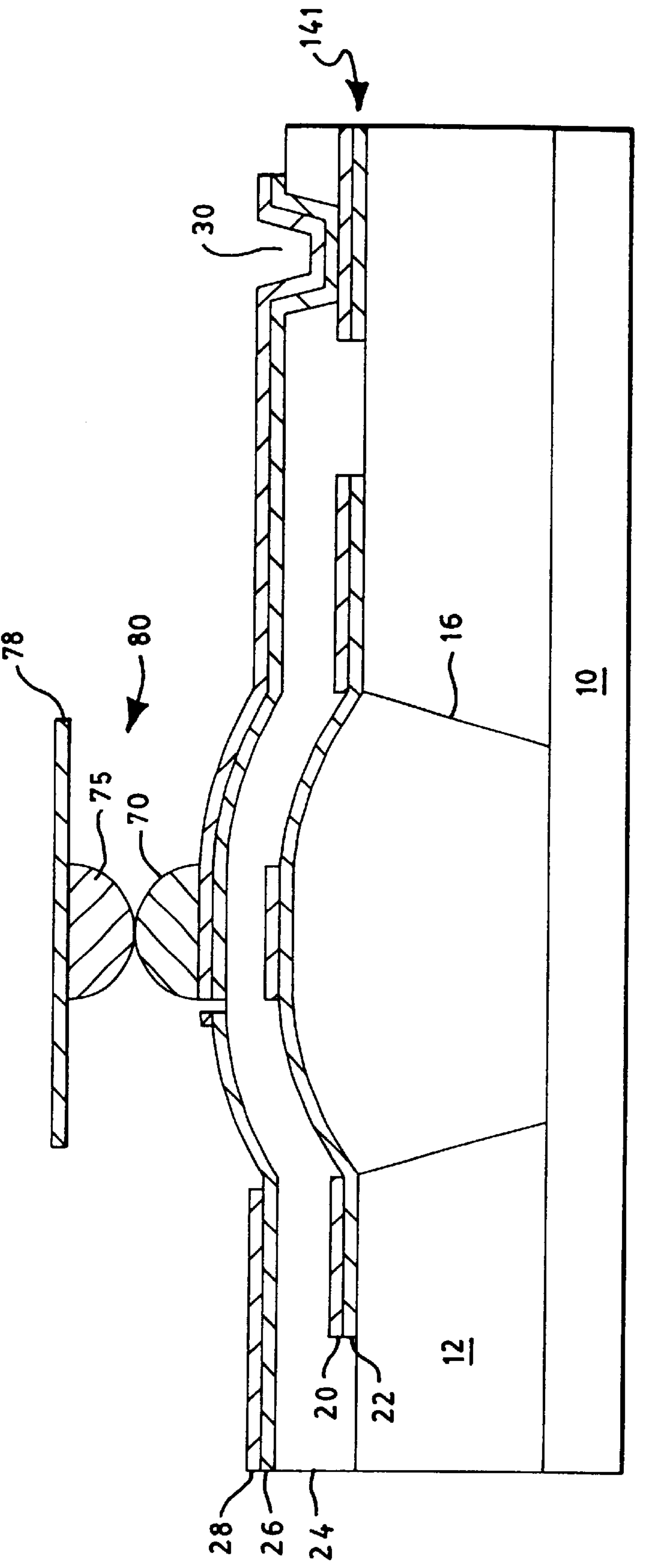
FIG. 8 is a sectional view similar to FIG. 7 further showing the first patterned SMA patterned layer, the first patterned conductive layer, the second patterned SMA layer, the second patterned conductive layer in a second stable position, and the movable contact pad in contact with an external contact pad resulting in a closed switch.

As shown in FIG. 8, the first SMA layer 22, the first conductive layer 20, the second SMA layer 26 and the second conductive layer 28 have a second stable position that is permissible due to the mechanical design of the shaped switch structure. This results in an SMA switch structure that has two stable positions (as shown in FIGS. 7 and 8) similar to the "oil can" structure that is used in bimetallic temperature sensors.

The bistable switch structure can be moved from the first stable position to the second stable position by passing sufficient electricity/current through the first SMA layer 22 so that the SMA material heats and contracts causing the structure to invert to the second stable position (the open position). FIG. 8 additionally illustrates an external contact pad 75 (attached to any appropriate support surface 78) to which movable contact pad 70 comes in contact when in the second stable position. The bistable switch structure open position can be reversed by passing current through the second SMA layer 26 (heating it and thereby causing contraction of the top layer) resulting in the bistable switch structure returning to the first stable state (the closed position). The use of the terminology "first position" and "second position" do not imply that one position has priority over another. Once the switch structure is in one of the two positions, the structure will remain in that position until current is selectively applied to change the position due to the bistable nature of the structure.

Figure 9:
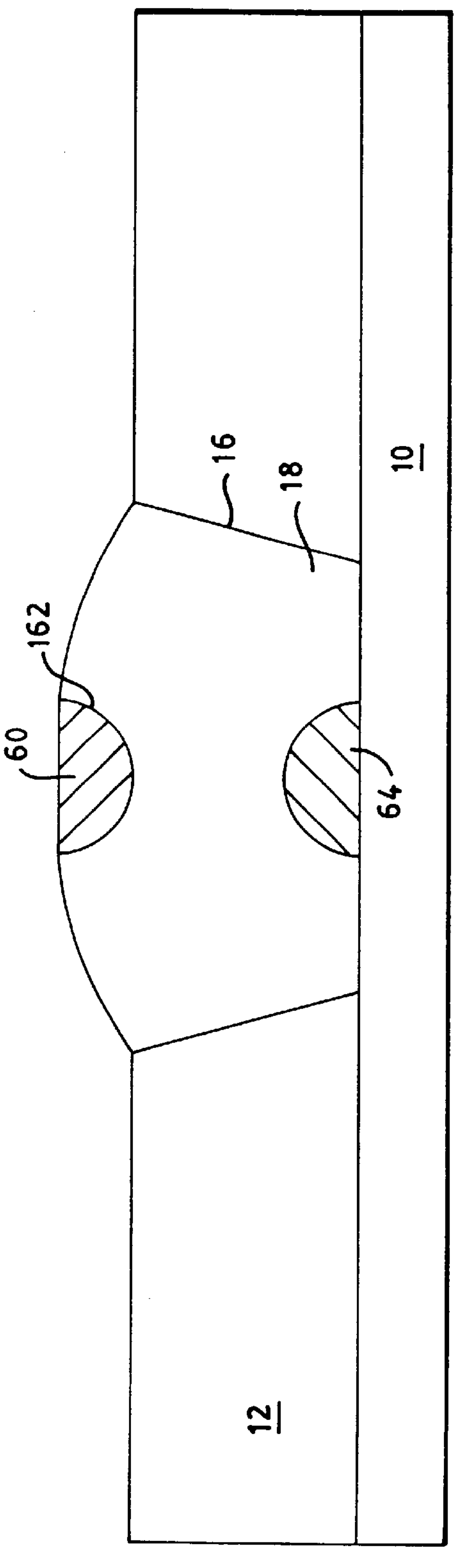
FIG. 9 is a sectional side view similar to that of FIG. 1 further showing a pre-positioned fixed contact pad, an optionally shaped removable material, a partial opening in a removable filler material, and movable contact pad metallization.

FIG. 9 is a sectional side view similar to that of FIG. 1 further showing a pre-positioned fixed contact pad 64, a partial opening 162 in the removable filler material, and a movable contact pad 60.

A fixed contact pad 64 is formed on base surface 10 within cavity 16 by a method such as a palladium electroless deposition process or an palladium electroplating process performed through a mask or with a photoresist process. In one embodiment, polymer or photo-polymer deposition is used with a palladium seed layer prior to further electroless deposition or electroplating of palladium.

Preferably the contact pad is attached prior to application of first plastic interconnect layer 12. Alternatively, the contact pad can be attached prior to insertion of removable material 18 in cavity 16, or after the removable material is at least partially removed from the cavity. It is also preferable to form an electrical connection path (not shown) to the fixed contact pad on the base surface prior to application of the first plastic interconnect layer. A via (not shown) can be formed in the first plastic interconnect layer to contact this path.

Preferably, as shown in FIG. 9, the removable filler material extends above the surface of the first plastic interconnect layer 12 so as to create a curve or other raised portion for subsequently applied SMA and conductive layers. In this embodiment, it may be possible to design the shape of the filler material so that the SMA and conductive layers are shaped in a desired position by their application and patterning and do not require separate shaping measures.

Partial opening 162 can be formed by any appropriate method. In one embodiment it is formed by laser machining, for example. To form the movable contact pad 60, in one embodiment a seed layer of metal such as palladium tin chloride is then applied. The plastic interconnect layer can be dipped in an electroless gold solution, for example, to form a first contact pad layer (not shown) with a barrier material such as nickel being applied as a second contact pad layer (not shown) and a material such as copper can be used to plate a thicker third contact pad layer (not shown). These contact pad layers can be etched to leave contact pad 60 in the area of partial opening 162.

Figure 10:
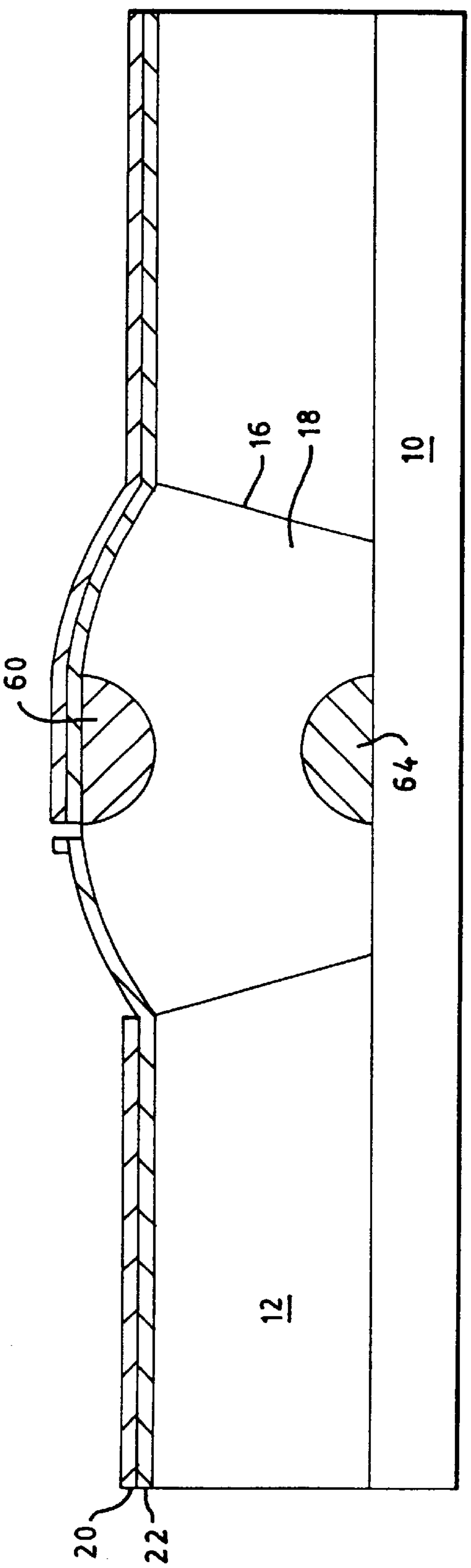
FIG. 10 is a sectional view similar to that of FIG. 9 further showing the first patterned SMA layer, the first patterned conductive layer and movable contact pad metallization.

FIG. 10 is a view similar to that of FIG. 9 further showing the addition of patterned SMA and conductive layers 22 and 20 which can be formed in a manner analogous to that described with respect to FIGS. 1–6.

FIG. 11 is a view similar to FIG. 10 further showing the addition of second plastic interconnect layer 24, second SMA layer 26, and second conductive layer 28. The SMA actuation arms 41, 42, 43, 44, 51, 52, 53, 54 (shown in FIG. 12) can be annealed after the removable filler material has been removed by passing a high current through the arms or selective laser heating. FIG. 11 further shows the switch in the second stable position wherein the movable contact 60 is positioned away from the fixed contact 64.

Figure 12:
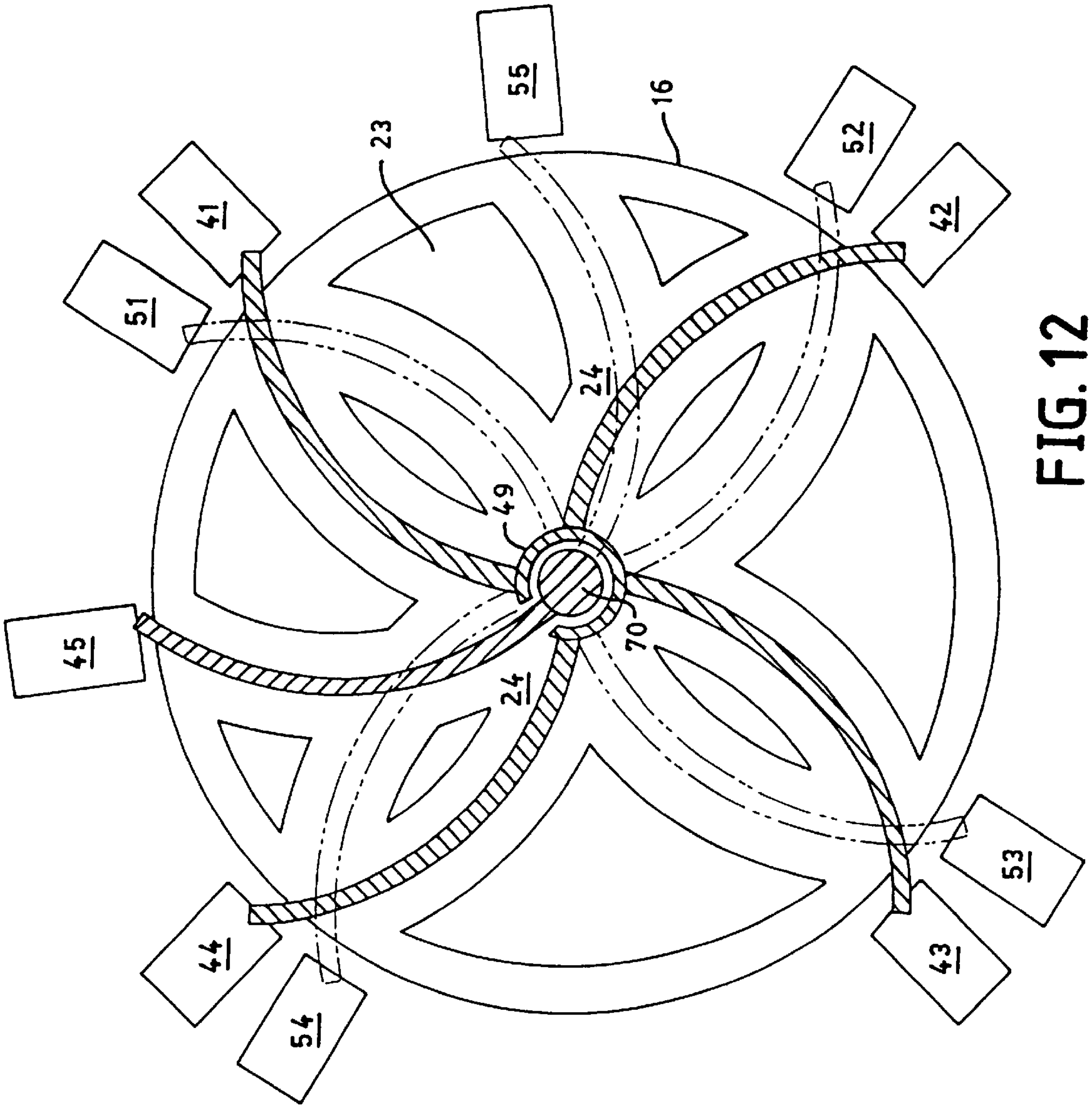
FIG. 12 is a top view showing an embodiment for the arms of the first and second patterned SMA and conductive layers.

FIG. 12 is a top view showing an embodiment for the arms of the first and second patterned SMA layers. In the embodiment of FIG. 12, the second SMA and conductive layers 26 (shown by arms 41, 42, 43, and 44) and 28 (shown by center portion 28 and conductive path 45) are patterned in a similar manner as discussed with respect to FIGS. 5 and 6. First conductive and SMA layers 20 and 22 are additionally patterned prior to the application of second plastic interconnect layer 24 in a similar manner with arms 51, 52, 53, and 54 and conductive path 55 being offset from arms 41, 42, 43, and 44 and conductive path 45. In one embodiment, as shown, it is useful to remove areas 23 of plastic interconnect layer 24 while leaving plastic interconnect layer 24 adjacent both sets of arms and the contact pad. Adjusting the length, arm width, arm numbers and pitch of the SMA material will allow a greater latitude in switch structure performance. Larger arms will result in greater contact travel while shorter and/or stiffer arms will result in higher contact force. While the arms are shown spiraled, it is also possible make the arms straight or straight line segments for greater control of the switch structure compliance as has been the case with silicon based MEM based actuators and switches.

Although, not shown in FIG. 12, the movable contact pad 60 (shown in FIGS. 11 and 13) is situated below center portion 28 and first SMA layer 22 (not shown in FIG. 12) and is attached to connection conductive path 55 (shown in FIG. 12) which includes a portion of the first SMA and conductive layers.

As shown in FIG. 13, when the bistable switch structure is in the first stable position, the fixed contact pad 64 is in direct contact with the movable contact pad 60 and an electrical connection is made forming a closed switch. The initial height of the removable filler material 18 (FIGS. 9 and 10) should be high enough so that there will be sufficient over-travel to generate contact pressure in the first stable position. As further shown in FIG. 11, when the bistable switch structure is in the second stable position the fixed contact pad 64 and the movable contact pad 60 are not in direct contact and thereby the electrical connection is open and an open switch is formed.

Figure 14:
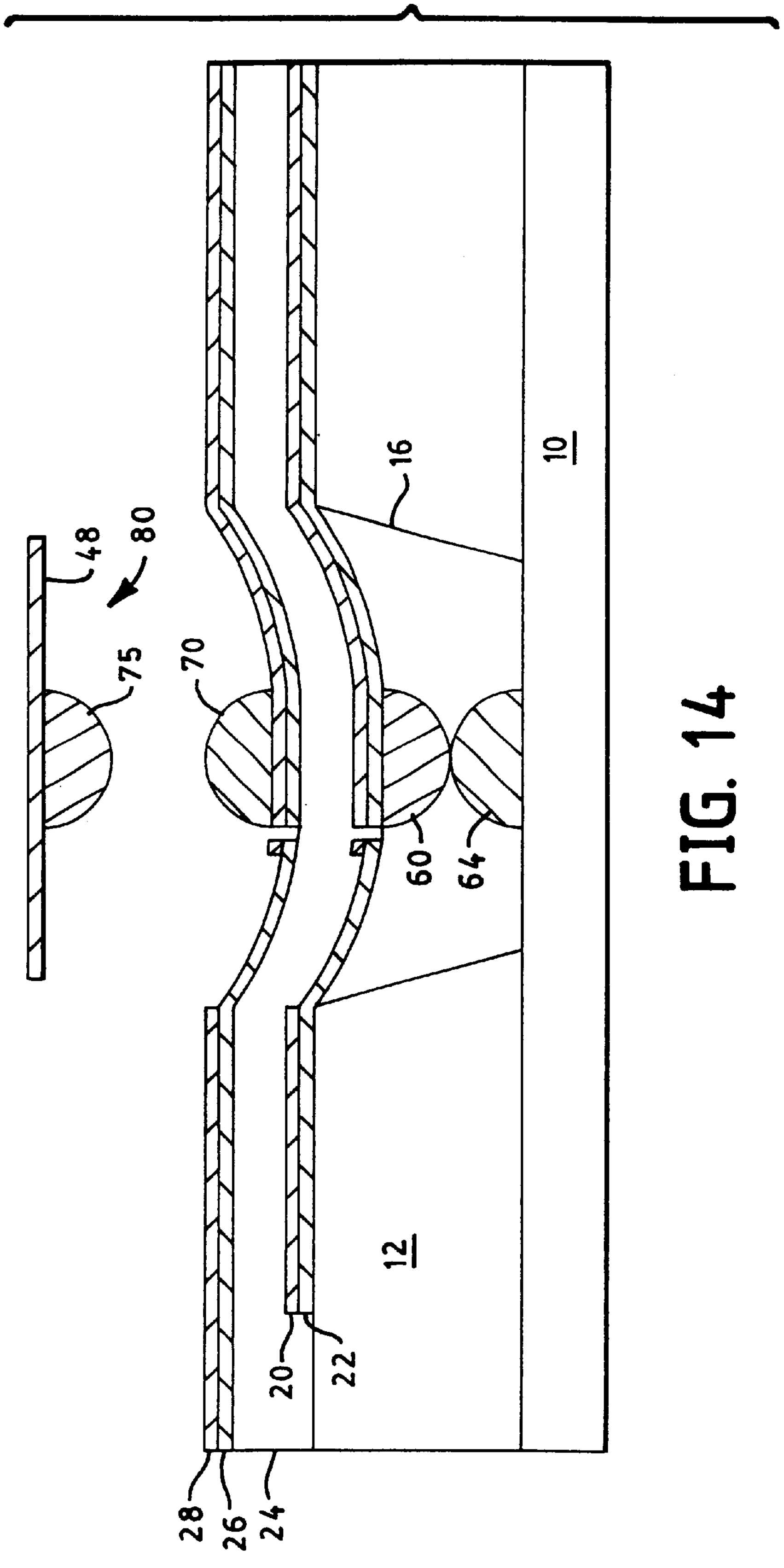
FIG. 14 is a view similar to FIG. 10 further showing a first movable contact pad and a fixed contact pad within the switch structure wherein the first movable contact pad is contacting the fixed internal contact pad as a closed switch in the first stable position and a second movable pad is in an open switch position with an external contact pad.
Figure 15:
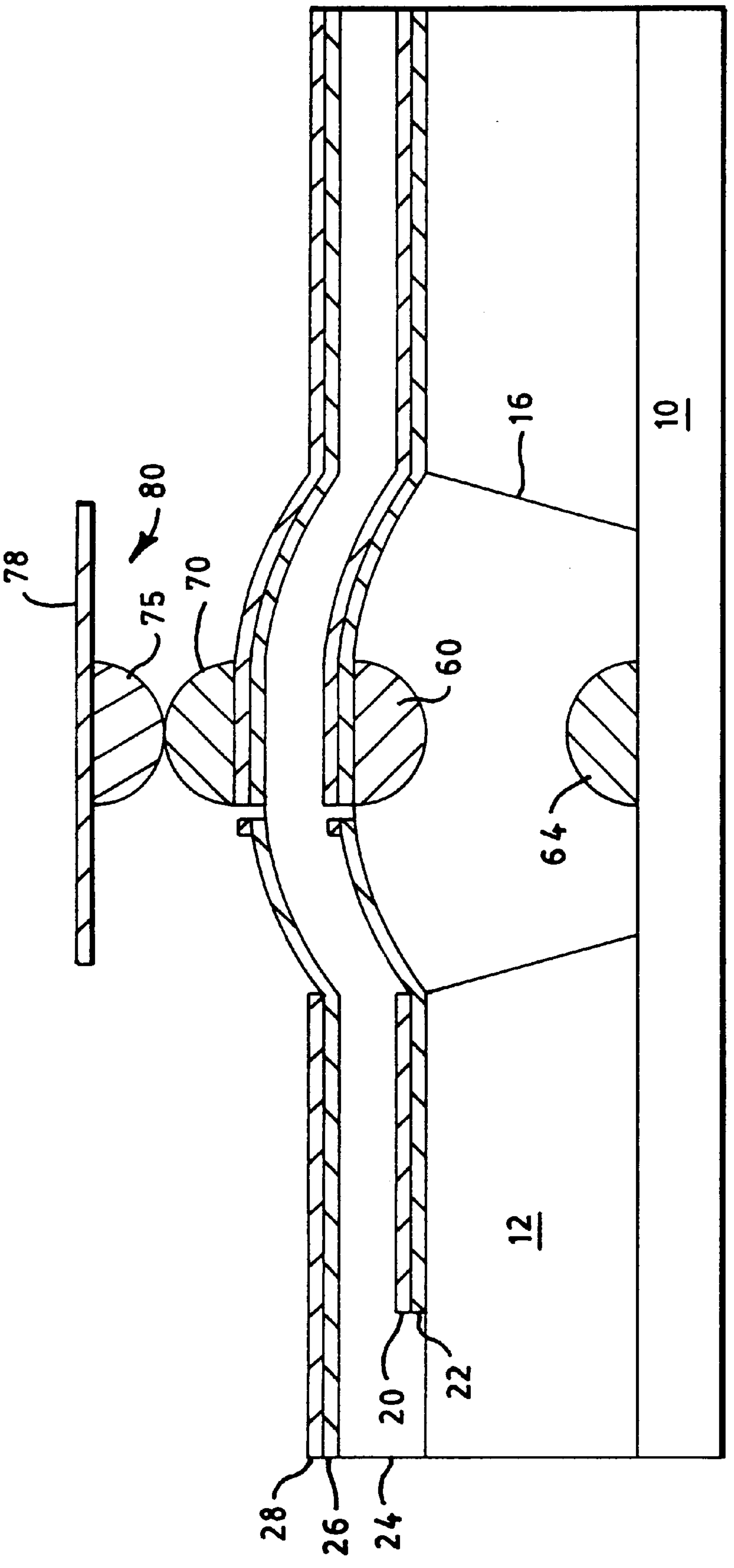
FIG. 15 is a view similar to FIG. 11 further showing a first movable contact pad and a fixed contact pad within the switch structure wherein the movable contact pad and the fixed contact pad form an open switch in the second stable position and a second movable pad forms a closed switch with an external contact pad.

FIG. 14 and FIG. 15 are views of a further embodiment of the SMA switch structure of FIG. 11 and FIG. 13 wherein a second movable contact pad 70 is attached to the second patterned conductive layer 28. Further an external switch structure 80 is placed above the movable contact pad 70 such that a second switch is formed having an open position as shown in FIG. 14 and a closed position as shown in FIG. 15 thereby forming a single pole double throw switch mechanism. Moving contacts 70 and 60 can be isolated as shown in FIGS. 14 and 15 or be connected with a via 30 through the second dielectric layer 24 such as shown in FIGS. 4 and 5. External switch structure 80 comprises an external contact pad 75 attached to a base layer 78.

In one embodiment bistable switch structures can be formed using two opposing bistable switch structures as shown in FIGS. 16 and 17. As shown in FIG. 16, bistable structure 90 is in the second stable position. Further bistable switch structure 90 has a second movable contact pad 70 positioned on the patterned metallized layer 28. A second bistable switch structure 100 is inverted directly above the first bistable switch structure 90 and is likewise in the second stable position. The second movable contact pad 71 is in direct contact with the second movable contact pad 70 to form a closed switch.

As further shown in FIG. 17, both bistable switch structures 90 and 100 are in their first stable positions, whereby the second movable contact pad for both bistable switch structures are not in direct contact and form an open switch between contact pads 70 and 71 and closed switches between both sets of contact pads 60 and 64.

While not shown, it is also possible to maintain the switch structure 90 in the first stable position shown in FIG. 17 and second switch structure 100 in the second stable position shown in FIG. 16 so that only contacts 64 and 60 are in contact forming a closed switch. It can be seen that the switch structure of FIGS. 16 and 17 can form four stable switching positions.

In many RF applications it is not possible to re-route an RF signal to a MEMs switch. With one embodiment of the present invention, fabrication of an RF switch in the RF path of a microwave multichip module can advantageously be used to maintain a uniform characteristic impedance. In this embodiment of the present invention, it is possible to form capacitive or microwave switches or shunts using the change in capacitance between the first SMA layer 22, the first conductive layer 20, and a transmission line 80 passing within the cavity as shown in FIG. 18 and FIG. 19. A transmission line is formed by fabricating a conductor strip 80 over a ground plane 84 using the HDI fabrication means or other suitable multilayer circuit fabrication techniques such as co-fired ceramic or printed wiring board methods. The first dielectric layer 12 is then applied over the transmission line structure in a manner such as described with respect to FIG. 1. The structure of FIG. 5 is then fabricated with a removable filler material in cavity 16, first and second SMA layers 22 and 26, first and second conductive layer 20 and 28 however, the contact 70 of FIG. 5 can be eliminated in this embodiment. For interconnection purposes, optional vias (not shown) can be formed in the lower layer 86 and/or, as shown by via 15, can be formed in first plastic interconnect layer 12 as discussed above with respect to FIG. 4 which extends to an electrical path 9 which can be formed simultaneously with the transmission line prior to application of first plastic interconnect layer 12. A capacitance is established between the first SMA layer 22, the first conductive layer 20, and the transmission line 80.

As shown in FIG. 18, the first SMA layer 22, the first conductive layer 20, the second SMA layer 26 and the second conductive layer 28 are in the first stable position. In the first stable position, they are at the least distance from the transmission line 80 wherein the resulting capacitance of the RF switch or microwave shunt is at a first value and the structure 110 forms a closed RF switch or microwave shunt. Although the diagram of FIG. 18 shows the thickness of first plastic interconnect layer 12 to be large with respect to the thickness of lower layer 86 for clarity, in an actual switch the thickness of first plastic interconnect layer 12 will typically be on the order of microns and the thickness of lower layer 86 will typically be on the order of hundreds of microns.

As further shown in FIG. 19, the first SMA layer 22, the first conductive layer 20, the second SMA layer 26 and the second conductive layer 28 are in the second stable position. In the second stable position the distance from the first SMA layer 22 and the first conductive layer 20 are at the maximum distance from the transmission line 80, the resulting capacitance is a second value which is less than the first value and the bistable structure 110 forms an open RF switch or microwave shunt. Performance of switches fabricated using silicon based MEM structures is limited by the small displacements (3–5 microns) possible with silicon MEM structures. The switch structure 110 can be placed in the RF path when the RF signal path can not be rerouted. The switch structure 110 disclosed herein may result in a greater displacement of 25 microns or more resulting in much greater on to off ratios of capacitance and therefore isolation in RF and microwave systems. These microwave switches can be used in combination with the embodiments of FIGS. 1–17, if desired. For example, a contact pad (not shown) could be positioned above second conductive layer 28.

Another embodiment of the present invention is shown in FIG. 20, wherein a force return device 74 such as spring, for example, is applied to operate the switch structure 120. It is sometimes desirable to provide interconnections within the structure such that control signals can be connected to the various components of the switch mechanism. In the embodiment of FIG. 20, metallized interconnect vias 15 are formed in the first dielectric layer 12 using a process such as described in aforementioned Eichelberger et al., U.S. Pat. No. 4,894,115, for example, before the addition of the first SMA layer 22 to provide connections from the SMA layer 22 and contact connection 45 to drive and interconnect circuitry that is formed on substrate 10 before the switch mechanism fabrication is started. This interconnection means will allow the routing of signals between the control circuits (not shown) and the SMA actuator pads as well as connections to the contact pads of switches such as shown in FIGS. 5 and 11,17 and 20. In this embodiment only one SMA layer is required. FIG. 20 additionally illustrates an embodiment wherein SMA layer 22 is patterned prior to the application of conductive layer 20 and wherein conductive layer 20 extends into vias 15 and into contact with electrical path 9 on base surface 10.

In some embodiments, a dielectric layer (not shown) may be useful between SMA layer 22 and the force return device to act as a buffer. In the embodiment of FIG. 20, there would only be a single unenergized state. In this first unengerized position, the force return device forces the movable contact pad towards the fixed contact pad. The switch structure 120 would flex toward the an open second position when the SMA layer 22 is heated and remain in this second position only as long as the SMA layer remains heated. In this embodiment, other force return mechanisms, such as air, water and pressure differential devices, for example, may be used in place of the spring. While FIG. 20 demonstrates a switch which has the force return device closing the switch, those skilled in the art will be able to provide the force return device to force the contacts into the open position in the non-energized case.

The BGA compliant structures described in aforementioned Wojnarowski et al. U.S. patent application Ser. Nos. 08/781,972 and 08/922,018, have been tested and been shown to permit movement in excess of 25 microns and to withstand forces of greater than 200 grams force. A large number of switches/actuators of the present invention can be fabricated in a single integral HDI multi-chip module package, for example, without requiring the space of conventional switches.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for fabricating a switch structure comprising:

applying a plastic interconnect layer overlying a base surface;

forming a cavity extending in the plastic interconnect layer to the base surface;

filling the cavity with a removable filler material;

applying and patterning a shape metal alloy (SMA) layer over the plastic interconnect layer and the filler material;

applying and patterning a conductive layer over at least a portion of the SMA layer, wherein applying and patterning the SMA layer and applying and patterning the conductive layer result in at least one portion of the filler material not being covered by either the SMA layer or the conductive layer;

removing at least some of the removable filler material from the cavity;

annealing the SMA layer;

shaping the SMA layer and the conductive layer, wherein annealing and shaping causes the SMA layer to contract and move the conductive layer further away from the base surface when sufficient electricity is applied to the SMA layer.

2. The method of claim 1 further comprising applying a fixed contact pad to the base surface within the cavity, and applying a movable contact pad on the SMA layer within the cavity, wherein annealing is performed in a non-oxidizing atmosphere, and shaping the SMA layer and the conductive layer further comprises shaping the SMA layer and the conductive layer to form a first stable position whereby the SMA layer and the conductive layer move towards the base surface and the movable contact pad touches the fixed contact pad to provide an electrical connection between the movable and fixed contact pads.

3. The method of claim 2 wherein shaping the SMA layer and the conductive layer forms a second stable position whereby the SMA layer and the conductive layer flex away from the base surface and the movable contact pad does not touch the fixed contact pad, thereby providing an open electrical connection between the movable and fixed contact pads.

4. The method of claim 1 wherein the conductive layer comprises a first conductive layer and the SMA layer comprises a first SMA layer and further including:

applying and patterning a second plastic interconnect layer overlying the first conductive layer and the first SMA layer;

applying and patterning a second shape memory alloy (SMA) layer overlying the second plastic interconnect layer;

applying and patterning a second conductive layer overlying the second SMA layer;

annealing the second SMA layer, wherein shaping the first SMA layer and first conductive layer further comprises shaping the second SMA layer and the second conductive layer such that when electricity is applied to the second SMA layer, the second SMA layer contracts and moves the first conductive layer closer to the base surface.

5. The method of claim 4 wherein annealing the first and second SMA layers and shaping the first and second SMA and conductive layers creates a first stable position whereby the first SMA layer, the first conductive layer, the second SMA layer, and the second conductive layer flex towards the base surface and the movable contact pad touches the fixed contact pad and a second stable position whereby the first SMA layer, the first conductive layer, the second SMA layer, and the second conductive layer flex away from the base surface.

* * * * *